United States Patent [19]

Ishigaki et al.

[11] 4,363,006

[45] Dec. 7, 1982

[54] NOISE REDUCTION SYSTEM HAVING SERIES CONNECTED VARIABLE FREQUENCY FILTERS

[75] Inventors: Yukinobu Ishigaki; Yutaka Haramoto, both of Yokohama, Japan

[73] Assignee: Victor Company of Japan, Limited, Yokohama, Japan

[21] Appl. No.: 238,098

[22] Filed: Feb. 25, 1981

[30] Foreign Application Priority Data

Feb. 29, 1980 [JP] Japan .................................. 55-24676

[51] Int. Cl.$^3$ .............................................. H04B 1/64

[52] U.S. Cl. ......................................... 333/14; 455/72

[58] Field of Search ............................ 333/14; 455/72; 179/1 P

[56] References Cited

U.S. PATENT DOCUMENTS

| | | | |
|---|---|---|---|
| 3,753,159 | 8/1973 | Burwen | 179/1 P X |
| 3,795,876 | 3/1974 | Takahashi et al. | 333/14 |
| 4,101,849 | 7/1978 | Blackmer et al. | 333/14 |

*Primary Examiner*—Paul L. Gensler

*Attorney, Agent, or Firm*—Lowe, King, Price & Becker

[57] ABSTRACT

A noise reduction system having a compressor and an expander. The compressor comprises series connected high and low frequency band filters of the variable frequency type, the cut-off frequencies of which are respectively controlled in response to high and low frequency components of the output of the series connected filters so that they are shifted in opposite directions to each other independently as a function of the amplitude of the respective frequency components, whereby the amplitude range of the respective frequency band is emphasized to a constant value while the frequency range of the emphasized band is varied in response to the amplitude of the respective component. The expander comprises series connected high and low frequency band filters of the variable frequency type of which the cut-off frequencies are respectively controlled in response to high and low frequency components of the input to the expander so that they are shifted in opposite directions to each other in a manner similar to that of the compressor. Each of the filters of the expander has a complementary frequency response characteristic to that of the corresponding filter of the compressor to de-emphasize the emphasized frequency components to restore the normal amplitude and frequency ranges of the original signal.

7 Claims, 3 Drawing Figures

RECORDING MEDIUM
34
29
LPF
30
HPF
31
28
LFVF
32
44
45
C3
C4
VR2
46
RECTIFIER-INTEGRATOR
33
271
C1
VR1
C2
HFVF
27
26
42
41
LFVF
C7
C8
VR4
411
361
C5
VR3
C6
36
HFVF
RECTIFIER-INTEGRATOR
39
RECTIFIER-INTEGRATOR
40
LPF
37
HPF
38
35

NOISE REDUCTION SYSTEM HAVING SERIES CONNECTED VARIABLE FREQUENCY FILTERS

BACKGROUND OF THE INVENTION

The present invention relates to a noise reduction system in which the high and low frequency parts of the spectrum of a signal are emphasized respectively by series connected variable frequency type filters prior to transmission or recording and upon reception or reproduction the corresponding frequency parts of the emphasized signal are de-emphasized respectively by series connected variable frequency type filters.

In a prior art noise reduction system, the spectrum of a signal is divided into different frequency bands by filters at a transmitter or recorder and the frequency divided components are controlled by variable gain amplifiers respectively in response to their amplitudes and combined in an adder to generate an output signal which is negatively summed with the original signal so that the latter is compressed in amplitude. At a receiver or reproducing apparatus, the received signal is divided into frequency bands corresponding to the frequency bands of the transmitter and the frequency divided components are controlled by variable gain amplifiers respectively in response to their amplitudes and combined in an adder to generate an output so that the amplitude of the received signal is expanded to restore the original signal. This prior art system however is susceptible to drop-outs or relatively large level fluctuations and tends to degrade its frequency response characteristic if there is a discrepancy between the cut-off frequencies of the frequency dividing filters.

SUMMARY OF THE INVENTION

Accordingly, an object of the invention is to provide a noise reduction system which is immune to drop-outs or relatively large fluctuations which occur during transmission or reproduction.

The noise reduction system of the invention comprises a compressor including series connected high and low frequency band variable filters whose respective cut-off frequencies are controlled in response to signals derived from the output of the series-connected filters to emphasize the range of high and low frequency parts of an input signal independently of each other. The expander comprises series connected high and low frequency band variable filters whose respective cut-off frequencies are controlled in response to signals derived from the input of the series-connected filters to de-emphasize the range of high and low frequency parts of the emphasized signal independently of each other. The variable frequency filters of the expander each have a complementary frequency response characteristic to that of the corresponding filter of the compressor so that the amplitude of the original signal is restored. Preferably, the emphasis on the signal in the higher part of the spectrum is greater than the emphasis on the lower part of the spectrum, and likewise, the de-emphasis on the higher part of the spectrum is greater than the de-emphasis on the lower part of the spectrum.

Specifically, the variable cut-off frequency of the low frequency band filter is varied inversely as a function of a low frequency component of the input to the compressor and the variable cut-off frequency of the high frequency band filter is varied as a function of a high frequency component of the compressor input, so that for a high amplitude of the low and high frequency components the cut-off frequencies of the filters are shifted in directions away from each other while maintaining the amount of emphasis on the low and high frequency bands and for a low amplitude of the low and high frequency components the cut-off frequencies of the filters are shifted toward each other while maintaining the amount of the emphasis. In like manner, the variable cut-off frequency of the high frequency variable filter is varied inversely as a function of a low frequency component of the input to the expander and the variable cut-off frequency of the low frequency variable filter is varied as a function of a high frequency component of the expander input, so that for a high amplitude of the low and high frequency components the cut-off frequencies of the filters are shifted in directions away from each other while maintaining the amount of de-emphasis on the low and high frequency bands and for a low amplitude of the low and high frequency components, the cut-off frequencies of the attenuators are shifted toward each other while maintaining the amount of the de-emphases.

BRIEF DESCRIPTION OF THE DRAWINGS

The invention will be further described by way of example with reference to the accompanying drawings, in which.

DETAILED DESCRIPTION

Figure 1:
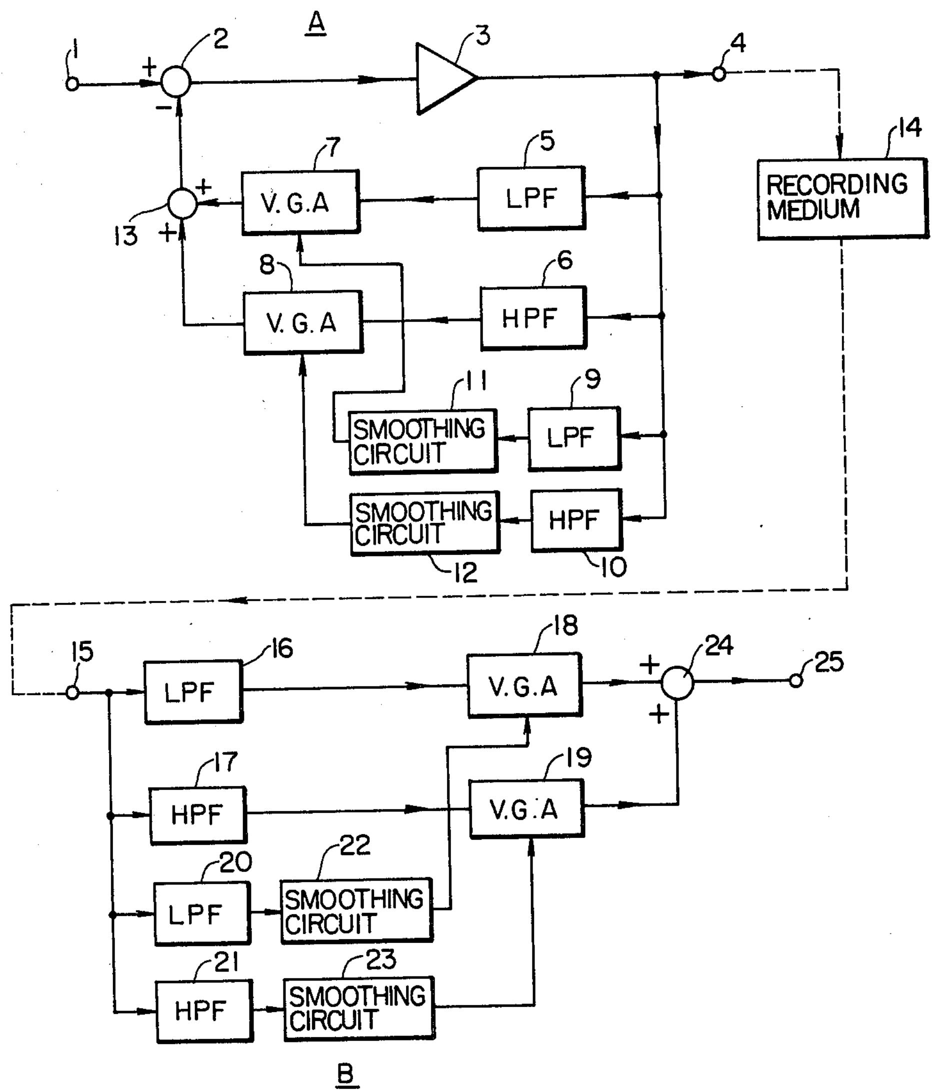
FIG. 1 is an illustration of a block diagram of an embodiment of the prior art noise reduction system.

Before describing the embodiment of the present invention reference is first had to FIG. 1 in which the prior art noise reduction system is schematically illustrated as generally comprising a compressor circuit A and an expander circuit B which are coupled through a recording medium or a transmission medium. The compressor circuit A comprises a main channel including a subtractor 2 and a linear amplifier 3 which are connected in series between input and output terminals 1 and 4, and a feedback circuit. This feedback circuit includes a low-pass filter 5, a high-pass filter 6 having their inputs connected together to the output terminal 4 to supply their output signals to variable gain amplifiers 7 and 8, respectively. The outputs of the variable gain amplifiers 7, 8 are connected to inputs of an adder 13 whose output is connected to a negative input of the subtractor 2. The filters 5 and 6 are designed so that their cut-off frequencies correspond to each other so that the full spectrum range is divided into low and high frequency bands. The signal at the output terminal 4 is also connected to a low-pass filter 9 and a high-pass filter 10 whose cut-off frequencies may be separated from one another. The output signals from the filters 9 and 10 are smoothed out by smoothing circuits 11 and 12, respectively, to generate control signals for application to the control terminals of the variable gain amplifiers 7 and 8. The amplifier gains of the amplifiers 7 and 8 are controlled inversely proportional to the amplitude of the respective low and high frequency signals so that their dynamic ranges are compressed independently of each other. The compressed signal is recorded into the recording medium 14 and reproduced for application to an input terminal 15 of the expander circuit B. The expander circuit B is similar to the feedback control circuit of the compressor circuit A with the exception that the operating characteristics of variable gain amplifiers 18 and 19 are complementary to the operating characteristics of the variable gain amplifiers 7 and 8, respectively. Filters 16 and 17 correspond respectively to the filters 5 and 6 of the compressor, filters 20 and 21 corresponding to the filters 9 and 10 respectively for supplying control signals via smoothing circuits 22 and 23 to the amplifiers 18, 19. The outputs of the amplifiers 18, 19 are combined in an adder 24 for application to an output terminal 25.

One drawback of this prior art system resides in the fact that if there is any discrepancy between the cut-off frequencies of the low-pass filter 5 and high-pass filter 6 (or 16 and 17), the frequency response characteristics of the full spectrum range are adversely affected, resulting in a system having a poor fidelity. Another drawback is that the prior art system requires the adders 13 and 24 which tend to act as sources of error due to tolerances since they affect the relative components of the combined signals. Due to the use of variable gain amplifiers the output signal will have large amplitude variations in response to drop-outs, or relatively large input fluctuations.

Figure 2:
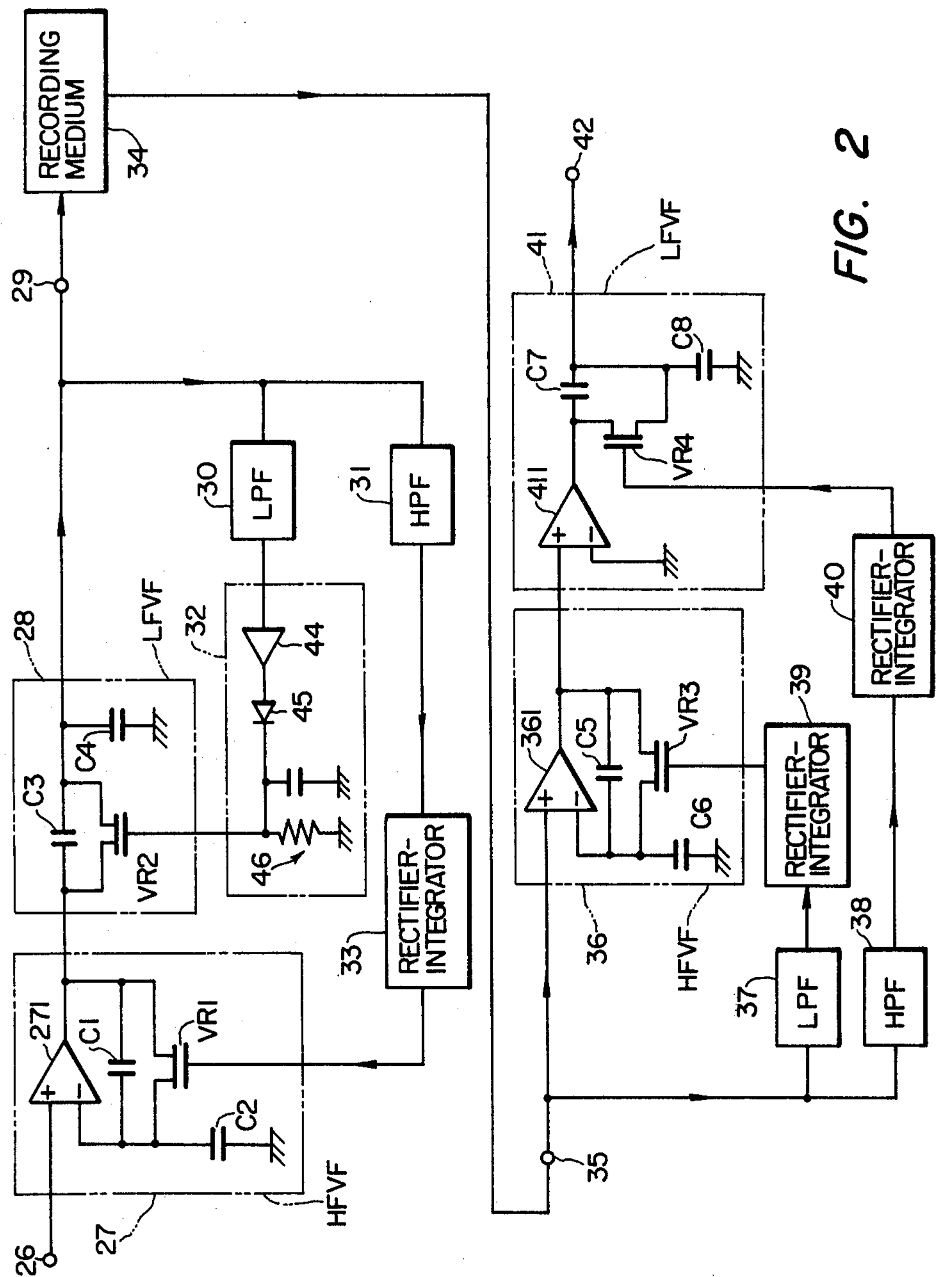
FIG. 2 is an illustration of a block diagram of an embodiment of the present invention.
Figure 3:
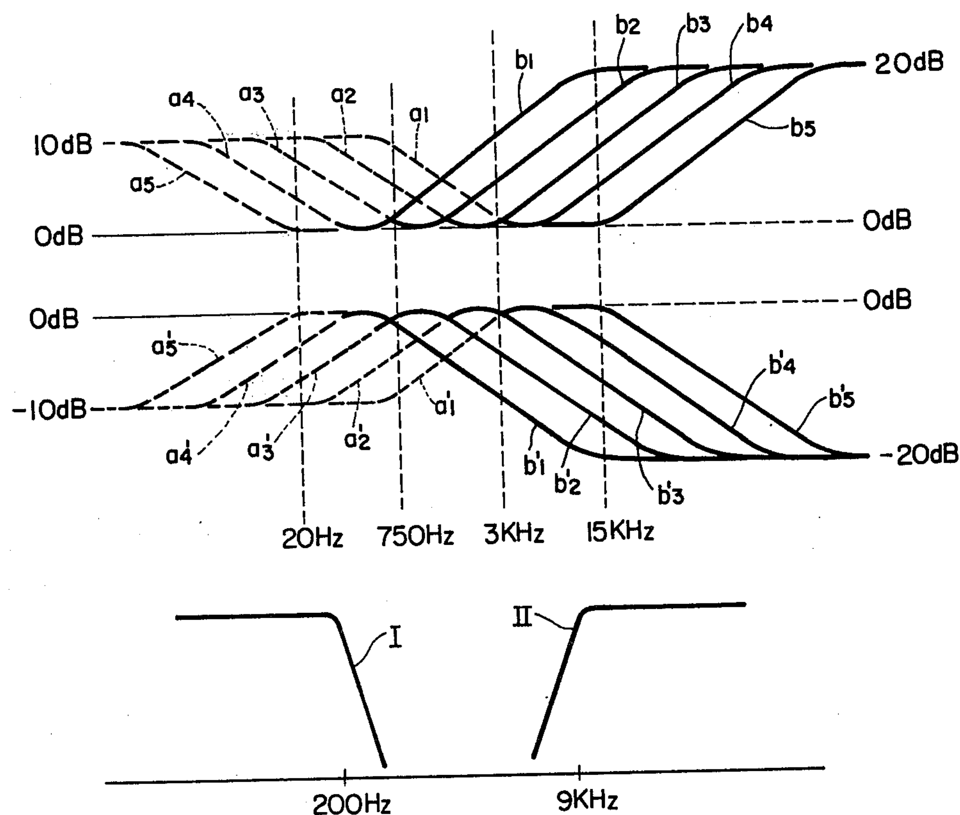
FIG. 3 is a graphic illustration of the frequency response characteristics of the various parts of the embodiment of the invention.

FIG. 2 is an illustration of the noise reduction system of the present invention. The system comprises a compressor circuit including a high frequency band variable filter 27 and a low frequency band variable filter 28 which are connected in series between input and output terminals 26 and 29 to the latter of which is connected a recording medium 34. To the output terminal 29 are also connected a low-pass filter 30 and a high-pass filter 31 the outputs of which are respectively coupled to rectifier-integrators 32, 33 to provide control signals to the variable frequency filters 28 and 27, respectively. The frequency response characteristics of the low-pass filter 30 and the high-pass filter 31 are indicated by numerals I and II in FIG. 3, respectively, of which the cut-off frequencies are separated by a band of frequencies typically from 200 Hz to 9 KHz. The rectifier-integrator 32 comprises a linear amplifier 44, a rectifier 45 and an integrator 46 all of which are connected in series between the output of the low frequency band variable filter 28. A low-frequency component of the signal at the output terminal 29 is passed through the low-pass filter 30, amplified at 44, rectified at 45 and integrated by the integrator 46 to develop a control voltage representing the magnitude of the low-frequency component of the spectrum which may encompass audio frequencies. The rectifier-integrator 33 is of the identical construction to that of rectifier-integrator 32 to develop a voltage representing the magnitude of the high-frequency component of the audio spectrum.

The high frequency band variable filter 27 comprises an operational amplifier 271 having the non-inverting input connected to the input terminal 26 and the inverting input connected to ground by a capacitor C2. The output terminal of the amplifier 271 is feedback-coupled to its inverting input by an integrator circuit formed by capacitors C1, C2 and a variable resistor element VR1 which takes the form of a field-effect transistor with its source and drain electrodes being connected in shunt with the capacitor C1 and its control gate connected to the output of the rectifier-integrator 33. A bipolar transistor may be used for the variable resistance element. For a given input signal applied to the gate electrode of the variable resistance element VR1, the high-pass filter 27 exhibits a predetermined frequency response which is characterized by an emphasis placed on signals in the higher frequency region above the cut-off frequency where the signal experiences a gradual variation from zero-dB level to a 20-bB level. This variable resistance element VR1 is arranged to vary its resistance value inversely as a function of the output of the rectifier-integrator 33 so that the cut-off frequency of the high frequency band variable filter 27 is shifted toward or away from the high frequency end of the spectrum as a function of the magnitude of a high frequency component of the signal at the output terminal 29, as indicated by solid-line curves $b_1$ to $b_5$ in FIG. 3.

The low frequency band variable filter 28 is composed of an integrator circuit formed by a field-effect transistor variable resistor element VR2 which is in shunt with a capacitor C3 and connected to ground by a capacitor C4. For a given input voltage applied to the gate of field-effect transistor element VR2, the low-pass filter 28 exhibits a predetermined frequency response which is characterized by an emphasis placed on signals in the lower frequency region below the cut-off frequency where the signal experiences a gradual variation from the zero-dB level to a level which is lower than the 20-dB level of the emphasis placed on the higher frequency region, a typical value of the higher level of the low-pass filter 28 being 10 dB. The variable resistance element VR2 is arranged to vary its resistance as a function of the control voltage supplied from rectifier-integrator 32 so that the cut-off frequency of the low frequency band variable filter 28 is shifted toward or away from the low frequency end of the spectrum inversely as a function of the magnitude of the low frequency component of the signal at the output terminal 29, as indicated by broken-line curves $a_1$ to $a_5$ in FIG. 3.

The input signal applied to the terminal 26 of the compressor thus experiences an emphasis on the lower frequency region as respresented by curves $a_1$ to $a_5$ and a further emphasis on the higher frequency region as represented by curves $b_1$ to $b_5$ and appears at the output terminal 29 and is recorded into the recording medium 34. The signal recorded in the medium 34, when reproduced, is applied to the input terminal 35 of the expander which comprises a high frequency band variable filter 36 and a low frequency band variable filter 41 which are connected in series between the input terminal 35 and an output terminal 42. The high frequency variable filter 36 comprises an operational amplifier 361 having its noninverting input connected to the input terminal 35 and its inverting input connected to its output by a feedback circuit formed by a capacitor C5 in shunt with a variable resistance field-effect transistor VR3. The inverting input the amplifier 361 is further connected to ground by a capacitor C6. The high frequency variable filter 36 is characterized by a frequency response having a negative emphasis, or attenuation, on signals in the lower frequency region of the spectrum below a cut-off frequency which is variable in response to an input signal applied to the control gate of the variable resistance element VR3. This frequency response characteristic is complementary to the frequency response characteristic of the low frequency band variable filter 28 so that the former varies from the zero-dB level to a minus 10 dB level as the frequency crosses the cut-off point. The variable resistance element VR3 is arranged to vary its resistance value as a function of the voltage level of a low frequency component of the signal appearing at the input terminal 35 so that the cut-off frequency of the high frequency band variable filter 36 is shifted toward or away from the low frequency end of the spectrum inversely as a function of the low frequency component of the input signal at the terminal 35, as indicated by broken-line curves $a_1'$ to $a_5'$ in FIG. 3.

The low frequency band variable filter 41 comprises an operational amplifier 411 having its noninverting input connected to the output of the high frequency band filter 36 and its inverting input connected to ground. The output of the operational amplifier 411 is connected to the output terminal 42 by a capacitor C7 in parallel with a field-effect transistor variable resistance element VR4. The output terminal of the capacitor C7 is connected to ground by a capacitor C8. The low frequency band filter 41 is characterized by a frequency response having a negative emphasis on signals in the higher frequency range of the spectrum above a cut-off frequency which is variable in response to an input signal applied to the control gate of the variable resistance element VR4. The frequency response characteristic of this low frequency variable filter is complementary to the frequency response characteristic of the high frequency variable filter 27 so that the former varies from the zero-dB level to a minus 20-dB level as the frequency crosses the cut-off point. The variable resistance element VR4 is arranged to vary its resistance value inversely as a function of the voltage level of a high frequency component of the signal appearing at the input terminal 35 so that the cut-off frequency of the low frequency band variable filter 41 is shifted toward or away from the high frequency end of the spectrum as a function of the low frequency component of the input signal at the terminal 35, as indicated by solid-line curves $b_1'$ to $b_5'$ in FIG. 3.

The control voltages respectively supplied to the variable frequency filters 36 and 41 are derived respectively from a low-pass filter 37 and a high-pass filter 38, each of which is connected to the input terminal 35. These filters have the same frequency response characteristics as those of the corresponding filters 30 and 31 of the compressor circuit. Rectifier-integrators 39 and 40 of the construction identical to the rectifier-integrators 32 and 33 are connected to the outputs of the low-pass filter 37 and high-pass filter 38, respectively, to generate control voltages for application to the control gates of the variable frequency filters 36 and 41.

The compressed signal applied to the input terminal 35 thus undergoes attenuation as it passes through the series connected filters 36 and 41 in a manner complementary to that of the component of the compressor circuit so that the medium frequency component of the input signal is expanded in level with respect to the low and high frequency components.

If the dominant components of the signal applied to the input terminal 26 lie within the low-to-medium frequency range of the spectrum and their signal level is relatively low, the higher frequency component of the noise introduced into the signal is held at a constant level regardless of the variation of the dominant frequency components, so that there is only a negligibly small variation of the residual noise that is contained in the signal at the output terminal 42. Likewise, if the dominant components of the input signal lie in the higher frequency range of the spectrum and the level of such components is relatively low, the lower frequency component of the noise introduced into the signal is also held at a constant value regardless of the variation of the dominant frequency components, so that the residual noise has only a negligibly small variation.

It can be seen from the above that the series connection of variable frequency in respective common signal paths as taught by the invention allows a noise reduction system in which the output signal is free from distortion in frequency response over the full spectrum range which might occur in the FIG. 1 prior art system where the signal is branched into frequency divided filters. Furthermore, since the feedback control circuits of the compressor and expander circuits as taught by the invention serve to control the cut-off frequencies of the associated variable frequency filters, drop-outs would result in shifting of the cut-off frequency so that the adverse effect of the drop-outs is rendered less noticeable as compared with the FIG. 1 prior art in which the drop-outs result in amplitude variations due to the use of variable gain amplifiers. Experiments showed that for input variations of less than 5 dB at the input terminal 35, the system of the invention is less responsive to such variations as compared with the FIG. 1 prior art system.

It is obvious that the full spectrum range of the input signal may be divided into more than two different frequency ranges to provide compression and expansion individually and that the filters 27 and 28 may be reversed in connection with respect to the input and output terminals 26, 29 and the filters 36 and 41 may also be reversed in connection with the respect to the terminals 35, 42.

What is claimed is:

1. A noise reduction system having a compressor circuit and an expander circuit, said compressor circuit comprising:

first input and output terminals, means connected to the first output terminal for generating a first control signal representing a high frequency component of a signal at said first output terminal, means connected to said first output terminal for generating a second control signal representing a low frequency component of said signal at said first output terminal, a first high frequency band variable filter, the cut-off frequency of which is variable as a function of said first control signal, and a first low frequency band variable filter, the cut-off frequency of which is variable inversely as a function of said second control signal, said high and low frequency band variable filters being connected in series between said first input and output terminals, said expander circuit comprising:

a second input terminal adapted for connection to said first output terminal, a second output terminal, means connected to said second input terminal for generating a third control signal representing a high frequency component of the signal at said second input terminal, means connected to said second input terminal for generating a fourth control signal representing a low frequency component of said signal at said second input terminal, a second low frequency band variable filter characterized with a complementary frequency response to the frequency response characteristic of said first high frequency band variable filter, and a second high frequency band variable filter characterized with a complementary frequency response to the frequency response characteristic of said first low frequency band variable filter, said second variable filters being connected in series between said second input and output terminals, the cut-off frequency of said second low frequency band variable filter being variable as a function of said third control signal and the cut-off frequency of said second high frequency variable filter being variable inversely as a function of said fourth control signal.

2. A noise reduction system as claimed in claim 1, wherein said means for generating said first control signal comprises high-pass filter and a first rectifier-integrator which are connected in series to said first output terminal, the output of said first rectifier-integrator being connected to said first high frequency band variable filter, and wherein said means for generating said second control signal comprises a low-pass filter and a second rectifier-integrator which are connected in series to said first output terminal, the output of said second rectifier-integrator being connected to said first low frequency band variable filter, the cut-off frequency of said high-pass filter being higher than the cut-off frequency of said low-pass filter.

3. A noise reduction system as claimed in claim 1, wherein said means for generating said third control signal comprises a high-pass filter and a first rectifier-integrator which are connected in series to said second input terminal, the output of said first rectifier-integrator being connected to said second low frequency variable filter, and wherein said means for generating said fourth control signal comprises a low-pass filter and a second rectifier-integrator which are connected in series to said second input terminal, the output of said second rectifier-integrator being connected to said high frequency band variable filter, the cut-off frequency of said high-pass filter being higher than the cut-off frequency of said low-pass filter.

4. A noise reduction system as claimed in claim 1, 2 or 3, wherein said first high and low frequency band variable filters include means for emphasizing the high frequency and low frequency parts of the spectrum of the signal at said first input terminal, respectively, the amount of the emphasis on the high frequency part being greater than the emphasis on the low frequency part.

5. A noise reduction system as claimed in claim 4, wherein said second low and high frequency band variable filters include means for de-emphasizing the high frequency and low frequency parts of the spectrum of the signal at said second input terminal, respectively, the amount of the de-emphasis on the high frequency part being greater than the de-emphasis on the low frequency part.

6. A noise reduction system as claimed in claim 4, wherein the frequency response characteristic of each of said first variable filters has a gradually varying emphasis as a function of frequency.

7. A noise reduction system as claimed in claim 5, wherein the frequency response characteristic of each of said second variable filters has a gradually varying de-emphasis as a function of frequency.

* * * * *